(12) United States Patent
Tang et al.

(10) Patent No.: US 8,324,705 B2
(45) Date of Patent: Dec. 4, 2012

(54) SCHOTTKY DIODES HAVING LOW-VOLTAGE AND HIGH-CONCENTRATION RINGS

(75) Inventors: Chien-Shao Tang, Hsin-Chu (TW);
Dah-Chuen Ho, Taichung (TW);
Yu-Chang Jong, Hsin-Chu (TW);
Zhe-Yi Wang, Hsin-Chu (TW);
Yuh-Hwa Chang, Shulin (TW);
Yogendra Yadav, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 554 days.

(21) Appl. No.: 12/127,629

(22) Filed: May 27, 2008

(65) Prior Publication Data

US 2009/0294865 A1 Dec. 3, 2009

(51) Int. Cl.
*H01L 29/872* (2006.01)

(52) U.S. Cl. ........... 257/484; 257/476; 257/E29.338; 257/E21.359

(58) Field of Classification Search .......... 257/476
See application file for complete search history.

(56) References Cited

U.S. PATENT DOCUMENTS

| | | | |
|---|---|---|---|
| 6,936,905 B2 * | 8/2005 | Wu | 257/484 |
| 7,397,102 B2 * | 7/2008 | Hshieh et al. | 257/471 |
| 2004/0211974 A1 * | 10/2004 | Wu | 257/107 |
| 2005/0242411 A1 * | 11/2005 | Tso | 257/480 |
| 2006/0220166 A1 * | 10/2006 | Kikuchi et al. | 257/481 |
| 2007/0052057 A1 * | 3/2007 | Drobny | 257/471 |
| 2008/0006899 A1 * | 1/2008 | Kim et al. | 257/476 |
| 2008/0135970 A1 * | 6/2008 | Kim et al. | 257/471 |
| 2009/0065888 A1 * | 3/2009 | Kato et al. | 257/476 |
| 2009/0236679 A1 * | 9/2009 | Chiang et al. | 257/483 |

* cited by examiner

*Primary Examiner* — Calvin Lee
*Assistant Examiner* — Abul Kalam
(74) *Attorney, Agent, or Firm* — Slater & Matsil, L.L.P.

(57) ABSTRACT

An integrated circuit structure includes a semiconductor substrate; a first well region of a first conductivity type over the semiconductor substrate; a second well region of a second conductivity type opposite the first conductivity type encircling the first well region; and a metal-containing layer over and adjoining the first well region and extending over at least an inner portion of the second well region. The metal-containing layer and the first well region form a Schottky barrier. The integrated circuit structure further includes an isolation region encircling the metal-containing layer; and a third well region of the second conductivity type encircling at least a central portion of the first well region. The third well region has a higher impurity concentration than the second well region, and includes a top surface adjoining the metal-containing layer, and a bottom surface higher than bottom surfaces of the first and the second well regions.

15 Claims, 4 Drawing Sheets

SCHOTTKY DIODES HAVING LOW-VOLTAGE AND HIGH-CONCENTRATION RINGS

TECHNICAL FIELD

This invention relates generally to integrated circuit devices, and more particularly to Schottky diodes with improved on-currents and reduced leakage currents, and methods for forming the same.

BACKGROUND

Schottky diodes are commonly used in applications requiring fast switching, for example, in power circuits. Also, while standard silicon diodes have a forward voltage drop of about 0.6 volts, Schottky diode's voltage drop at forward biases of around 1 mA may be in the range of 0.15 V to 0.45 V, making it useful in voltage-clamping applications and in applications for preventing transistor saturation. Schottky diode's higher current densities further distinguish it from other diodes.

FIG. 1 illustrates a cross-sectional view of a conventional Schottky diode 100, which is formed on p-type substrate 102. High-voltage p-well 104 is formed as a ring encircling high-voltage n-well 106. Shallow trench isolation ring 108 also encircles high-voltage n-well 106 and the inner portion of high-voltage p-well 104. Metal-containing layer 110 is formed over high-voltage p-well 104 and high-voltage n-well 106 to form a Schottky diode. N-type buried layer 112 separates Schottky diode 100 from the underlying p-type substrate 102, and provides electrical connection to the pickup regions 114 through high-voltage n-well 116.

Schottky diode 100 suffers from a low breakdown voltage. FIG. 2 illustrates an I-V curve of Schottky diode 100, wherein the X-axis indicates the reverse voltage VR applied on Schottky diode 100, and the Y-axis indicates the leakage current IR. It is noted that with the increase in the reverse voltage VR, the leakage current IR continues to increase significantly. Further, the Ion/Ioff ratio, which represents the Schottky diode's ability to provide forward currents without causing significant leakage currents (when reverse biased), is only about $1.2 \times 10^3$, which is unsatisfactory for applications demanding Schottky diodes with high performances. Schottky diodes with reduced leakage currents and increased on-currents are thus needed.

SUMMARY OF THE INVENTION

In accordance with one aspect of the present invention, an integrated circuit structure includes a semiconductor substrate; a first well region of a first conductivity type over the semiconductor substrate; a second well region of a second conductivity type opposite the first conductivity type encircling the first well region; and a metal-containing layer over and adjoining the first well region and extending over at least an inner portion of the second well region. The metal-containing layer and the first HVW region form a Schottky barrier. The integrated circuit structure further includes an isolation region encircling the metal-containing layer; and a third well region of the second conductivity type encircling at least a central portion of the first well region. The third well region has a higher impurity concentration than the second well region, and includes a top surface adjoining the metal-containing layer, and a bottom surface higher than bottom surfaces of the first and the second well regions.

In accordance with another aspect of the present invention, an integrated circuit structure includes a semiconductor substrate; a first high-voltage n-type well (HVNW) region over the semiconductor substrate; a first high-voltage p-type well (HVPW) region encircling and adjoining the first HVNW region; a metal-containing layer over and adjoining the first HVNW region and the first HVPW region, wherein the metal-containing layer and the first HVNW region form a Schottky barrier; an isolation region encircling and adjoining the metal-containing layer; a low-voltage p-type well (LVPW) region encircling, and spaced apart from, the first HVNW region, wherein the LVPW region extends from underlying the isolation region to underlying the metal-containing layer; a heavily doped p-type (P+) region underlying the metal-containing layer and encircling at least a central portion of the first HVNW region; a second HVNW region encircling and adjoining the first HVPW region; an n-type buried layer (NBL) over the semiconductor substrate, wherein the NBL is underlying and adjoining the first and the second HVNW regions and the first HVPW region; and an n-type heavily doped pickup region at a surface of the second HVNW region.

In accordance with yet another aspect of the present invention, an integrated circuit structure includes a semiconductor substrate of p-type; and a first and a second Schottky diode finger. The first Schottky diode finger includes a first HVNW region over the semiconductor substrate; a first HVPW region encircling and adjoining the first HVNW region; a first metal-containing layer over and adjoining the first HVNW region and the first HVPW region, wherein the first metal-containing layer and the first HVNW region form a first Schottky barrier; a first isolation region encircling and adjoining the first metal-containing layer; a first LVPW region encircling the first HVNW region; and a first P+ region encircling at least a central portion of the first HVNW region. The second Schottky diode finger includes a second HVNW region over the semiconductor substrate; a second HVPW region encircling and adjoining the second HVNW region, wherein the first and the second HVPW regions adjoin each other by one edge to form a continuous region; a second metal-containing layer over and adjoining the second HVNW region and the second HVPW region, wherein the second metal-containing layer and the second HVNW region form a second Schottky barrier, and wherein the first and the second metal-containing layers are physically disconnected, and electrically connected; a second isolation region encircling and adjoining the second metal-containing layer, wherein the first and the second isolation regions adjoin each other by one edge to form a continuous region; a second LVPW region encircling the second HVNW region, wherein the first and the second LVPW regions adjoin each other by one edge to form a continuous region; and a second P+ region encircling at least a central portion of the second HVNW region. The integrated circuit structure further includes a third HVNW region encircling the first and the second HVNW regions and the first and the second HVPW regions; an NBL over the semiconductor substrate, wherein the NBL is underlying and adjoining the first and the second HVNW regions, and the first and the second HVPW regions; and a third HVPW region encircling the first and the second HVNW regions, the first and the second HVPW regions, and the first and the second LVPW regions, wherein the third HVPW is electrically connected to the semiconductor substrate.

The advantageous features of the present invention include improved breakdown voltage, reduced leakage current, and increased on-current per unit area.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel Schottky diode is provided. The variations of the preferred embodiments are then discussed. Throughout the various views and illustrative embodiments of the present invention, like reference numbers are used to designate like elements.

Figure 1:
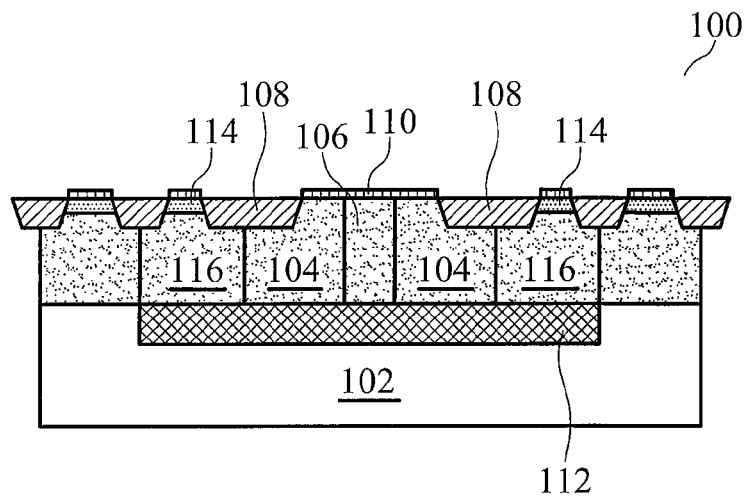
FIG. 1 illustrates a conventional Schottky diode.
Figure 2:
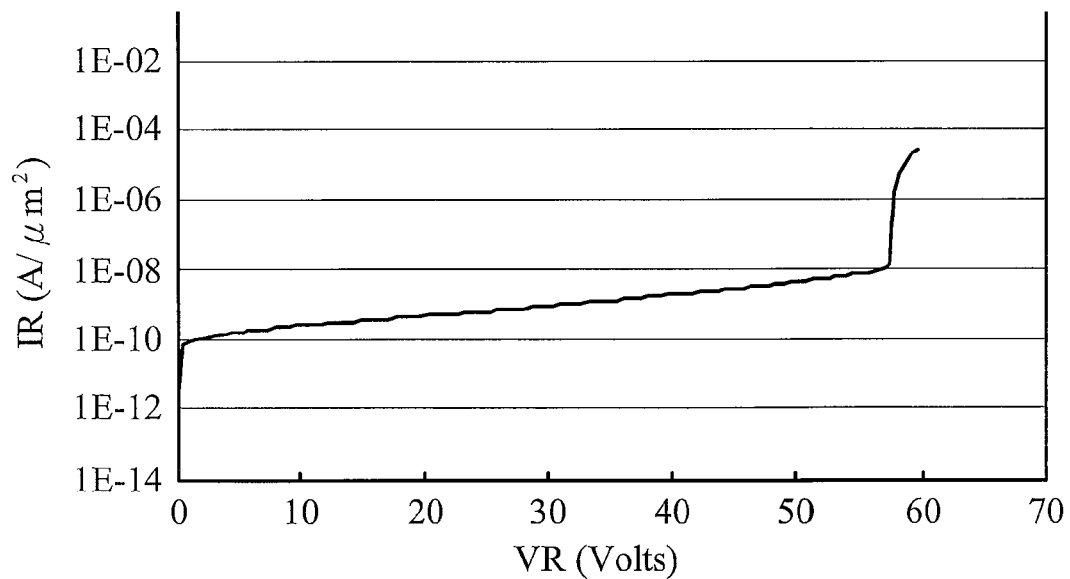
FIG. 2 illustrates an I-V curve of the Schottky diode shown in FIG. 1.
Figure 3:
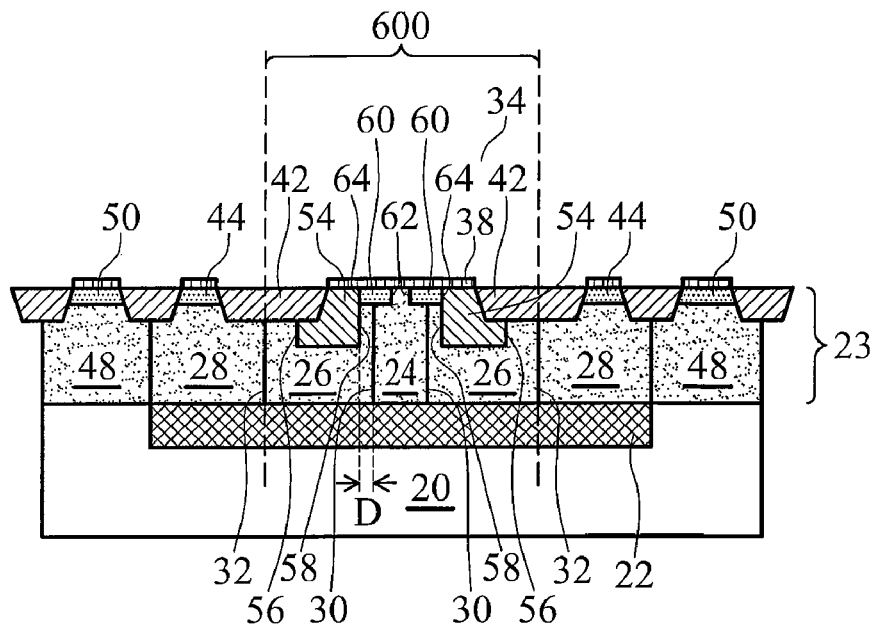
FIG. 3 illustrates a Schottky diode embodiment of the present invention.

FIG. 3 illustrates a cross-sectional view of a Schottky diode embodiment of the present invention. Semiconductor substrate 20 is formed of a semiconductor material, for example, silicon or other group III, group IV, and/or group V elements. Preferably, semiconductor substrate 20 is of p-type. N-type buried layer (NBL) 22 is formed to separate the p-type semiconductor substrate 20 from the overlying Schottky diode 34, which is discussed in detail in subsequent paragraphs. NBL 22 may be doped to a concentration of about $1E14/cm^3$ to about $1E18/cm^3$, for example. An exemplary formation process of NBL 22 and the overlying doped regions includes providing semiconductor substrate 20; implanting or diffusing a surface region of semiconductor substrate 20 to form NBL 22; epitaxially growing epitaxy layer 23 on NBL 22 and semiconductor substrate 20; and implanting epitaxy layer 23 to form implanted regions 24, 26, 28, 48, 50, 54, 60, and the like. Alternatively, NBL 22 and the overlying doped regions are all formed by implantation.

N-type well region 24 is formed on, and preferably adjoining, NBL 22. Throughout the description, n-type well region 24 is alternatively referred to as high-voltage n-well (HVNW) region 24 for its relatively low impurity concentration. HVNW region 24 may be formed by implanting epitaxy layer 23 with an n-type impurity, such as phosphorous and/or arsenic. In an exemplary embodiment, HVNW region 24 has an impurity concentration of between about $1E15/cm^3$ and about $1E18/cm^3$, although higher or lower impurity concentrations are also applicable. HVNW region 24 may have a rectangular shape in the top view.

HVNW 24 is encircled by high-voltage p-well (HVPW) region 26, which forms a ring. Similar to HVNW 24, HVPW region 26 may also be formed by implanting the epitaxy layer 23 with a p-type impurity, such as boron, indium, or the combinations thereof. An exemplary impurity concentration of HVPW region 26 is between about $1E14/cm^3$ to about $1E18/cm^3$. Preferably, the bottom of HVPW region 26 adjoins NBL 22.

HVNW region 28, which also forms a ring encircling HVPW region 26, is formed on and adjoining NBL 22. HVNW regions 24 and 28 may be formed simultaneously using a same photo mask. HVPW region 26 adjoins HVNW regions 24 and 28, resulting in interfaces (P-N junctions) 30 and 32, as shown in FIG. 3. In a top view, interfaces 30 and 32 are portions of a continuous interface ring.

Schottky diode 34 is formed at the surface of HVNW region 24 and HVPW region 26, and includes metal-containing layer 38 in contact with HVNW region 24. Partially due to a relatively low impurity concentration in HVNW region 24, a Schottky barrier is formed between metal-containing layer 38 and HVNW region 24. In an embodiment, metal-containing layer 38 includes a metal silicide. Alternatively, metal-containing layer 38 includes other materials suitable for forming Schottky barriers, such as pure metals, metal compounds, and the like. In an exemplary embodiment, metal-containing layer 38 includes titanium silicide, although other metal silicides, such as cobalt silicide, tantalum silicide, and combinations thereof, can be used. Metal-containing layer 38 may be formed using a self-aligned silicidation process, which includes selectively forming a metal layer (not shown) on HVNW region 24, and performing an anneal to react the metal with the underlying silicon. In an embodiment, the metal layer is fully consumed during the silicidation process. Alternatively, a layer of metal may be left un-reacted after the anneal.

Metal-containing layer 38 is surrounded by, and in physical contact with, isolation region 42. Preferably, isolation region 42 is a shallow trench isolation (STI) region, and hence is referred to as STI region 42 throughout the description. Alternatively, isolation region 42 may be a field oxide region formed, for example, by well-known local oxidation of silicon (LOCOS). STI region 42 forms a ring in a top view.

Heavily doped n-type (N+) contact region 44 is formed at the surface of HVNW region 28, and acts as a pickup region of the n-type regions including HVNW 28, NBL 22 and HVNW 24. In the described embodiments, "heavily doped" means an impurity concentration of greater than about $1E19/cm^3$, and more preferably between about $1E19/cm^3$ and $1E21/cm^3$. One skilled in the art will recognize, however, that "heavily doped" is a term of art that depends upon the specific device type, technology generation, minimum feature size, and the like. It is intended, therefore, that the term be interpreted in light of the technology being evaluated and not be limited to the described embodiments. N+ contact region 44 may also form a ring surrounding STI region 42 in a top view.

Encircling HVNW 28 is a HVPW region 48, and the respective pickup region 50, which is a heavily doped p-type region. Preferably, HVPW region 48 is formed simultaneously with HVPW region 26. Both HVPW region 48 and pickup region 50 are preferably rings surrounding HVNW ring 28, and act as isolation regions electrically isolating Schottky diode 34 from semiconductor substrate 20. HVPW region 48 is preferably electrically connected to semiconductor substrate 20, with no n-type regions therebetween. Accordingly, NBL 22 does not extend under HVPW region 48. Alternatively, NBL 22 extends to under only a portion, but not all, of HVPW region 48.

Schottky diode 34 further includes p-well region 54 underlying, and in contact with, metal-containing layer 38. Preferably, p-well region 54 has a higher impurity concentration than that of HVPW region 26, and the impurity concentration of p-well region 54 may be in an exemplary range of between about 1E16/cm$^3$ and about 1E18/cm$^3$. P-well region 54 is simultaneously formed with the well regions of low-voltage NMOS devices (for example, p-well region 74 of NMOS device 70 in FIG. 4), and hence is alternatively referred to as low-voltage p-well (LVPW) region 54. LVPW region 54 forms a ring encircling HVNW 24. The outer edge 56 is preferably underlying STI region 42. The inner edge 58 is preferably spaced apart from the interface 30 on the respective side, with distance D less than about 2 μm. Alternatively, the inner edge 58 overlaps (vertically aligned to) the interface 30 on the respective side (meaning distance D is equal to zero μm). The bottom of LVPW 54 is spaced apart from NBL 22 by a portion of HVPW region 26.

Figure 4:
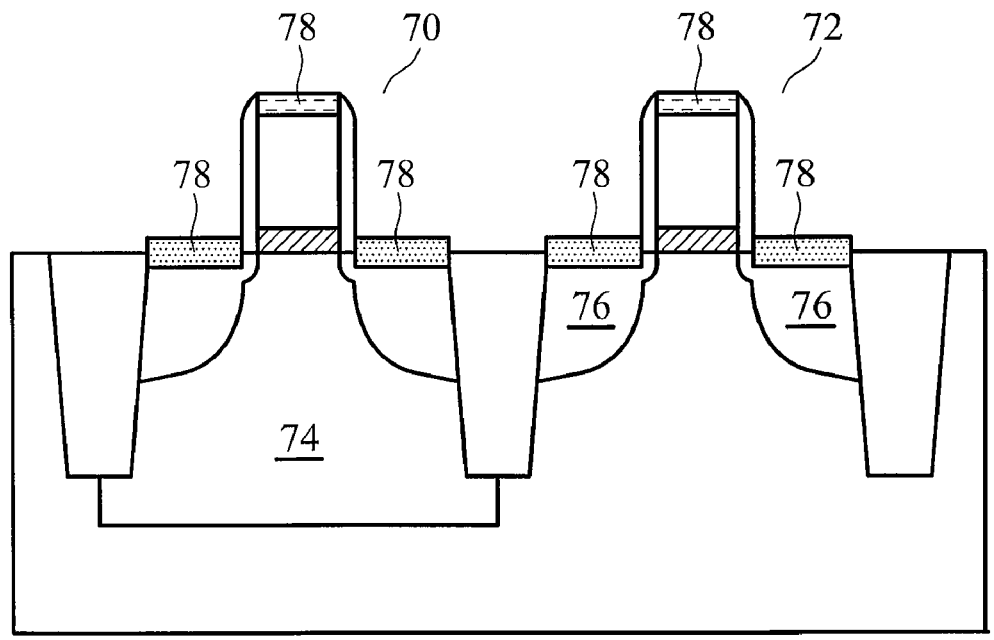
FIG. 4 illustrates core MOS devices having components formed simultaneously with the components of the Schottky diode shown in FIG. 3.

Schottky diode 34 further includes heavily doped p-type (P+) region 60 directly underlying metal-containing layer 38. Preferably, P+ region 60 has an impurity concentration substantially equal to the impurity concentrations of the source/drain regions of low-voltage PMOS devices (for example, PMOS device 72 as shown in FIG. 4) formed on same semiconductor substrate 20, which may be about 1E19/cm$^3$ and about 1E21/cm$^3$, for example. P+ region 60 forms a ring encircling at least a central portion, possibly an entirety, of HVNW region 24. Accordingly, P+ region 60 may overlap an outer portion of HVNW region 24. Alternatively, the inner edge 62 of P+ region 60 is spaced apart from interface 30. The outer edge 64 of P+ region 60 is preferably spaced apart from the inner edge of STI region 42, so that the leakage current may be reduced. In an embodiment, the outer edge 64 of P+ region 60 is vertically aligned to the inner edge 58 of LVPW region 54. In other embodiments, the outer portion of P+ region 60 may overlap the inner portion of LVPW region 54, wherein the bottom of P+ region 60 is higher than the bottom of LVPW region 54.

FIG. 4 illustrates NMOS device 70 and PMOS device 72, which may be logic MOS devices or core MOS devices formed on semiconductor substrate 20. MOS devices 70 and 72 are low-voltage devices operated under an operation voltage VDD lower than the operation voltages of input/output devices and other high-voltage devices. NMOS device 70 is formed in p-well region 74. Preferably, p-well region 74 is formed simultaneously as, and hence has a same depth and a same impurity concentration as, LVPW region 54 (refer to FIG. 3). Source/drain regions 76 of PMOS device 72 are preferably formed simultaneously as, and hence have a same depth and a same impurity concentration as, P+ region 60 and P+ pickup region 50 in FIG. 3. Silicide regions 78 of NMOS device 70 and/or PMOS device 72 are preferably formed simultaneously with metal-containing layer 38.

Figure 5:
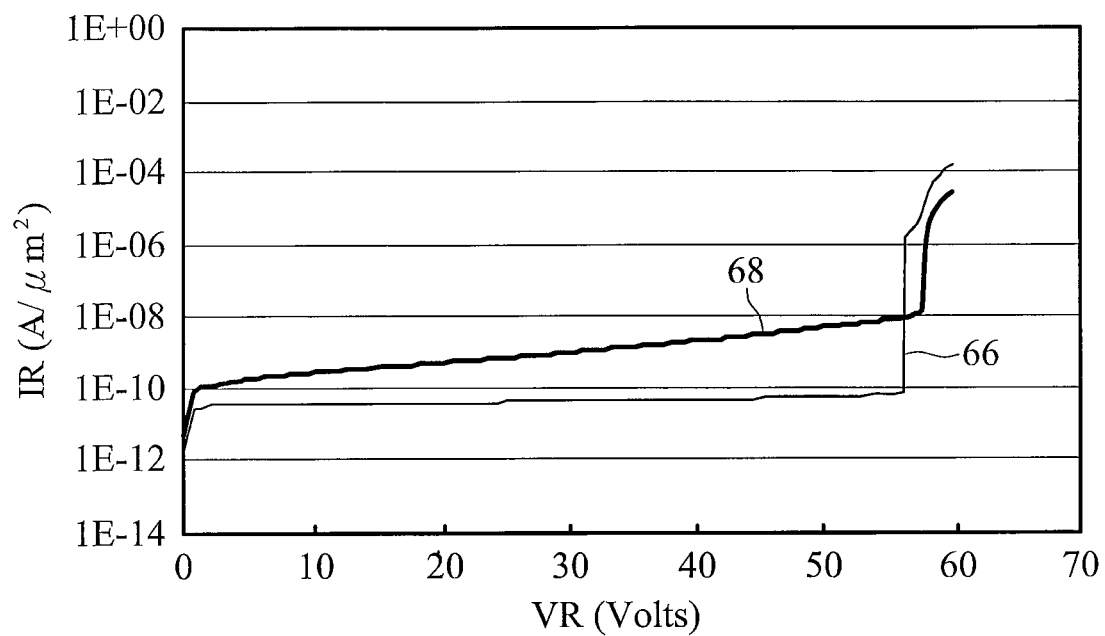
FIG. 5 illustrates I-V curves of the Schottky diode.

The formation of LVPW region 54 advantageously reduces the leakage current of Schottky diode 34. It is appreciated that depletion regions are formed at the P-N junctions between HVNW region 24 and HVPW region 26. The formation of LVPW region 54 and P+ region 60, which have higher p-type impurity concentrations than HVPW region 26, cause the depletion region to extend horizontally further into HVNW region 24 toward the center of HVNW region 24. When the Schottky diode 34 is reverse biased, which means metal-containing layer 38 is applied with a voltage more negative than N+ contact region 44, the depletion regions on both sides of HVNW region 24 quickly grow to the center, even if only a small reverse voltage is applied. When the depletion regions on opposing sides join each other, the path of the leakage current flowing between metal-containing layer 38 and HVNW region 24 is pinched. The leakage current is thus significantly reduced. An experiment result is shown in FIG. 5, which illustrates I-V curve 66 of Schottky diode 34 under reverse bias voltages. The X-axis shows reverse voltage VR applied on Schottky diode 34, and the Y-axis shows the leakage current IR. It is noted that the leakage current (line 66) of Schottky diode 34 is improved over the leakage current (line 68) of a conventional Schottky device, which has a similar structure as Schottky diode 34, except no LVPW region 54 and P+ region 60 are formed.

Figure 6:
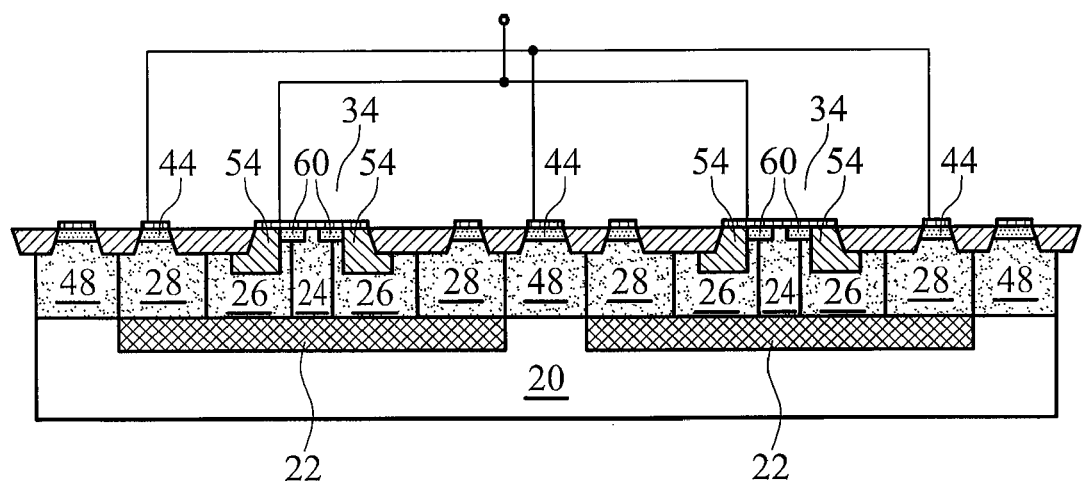
FIG. 6 illustrates another embodiment of the present invention, wherein a Schottky diode includes more than one finger.

To obtain greater on-currents, a plurality of Schottky diodes 34 as shown in FIG. 3 may be formed as fingers of a multi-finger Schottky diode, and connected in parallel. FIG. 6 illustrates an exemplary Schottky diode formed of two fingers, which includes two Schottky diodes 34, with the metal-containing layers 38 interconnected, and N+ contact region 44 interconnected. Accordingly, the on-current of the Schottky diode as shown in FIG. 6 may essentially be doubled over Schottky diode 34 in FIG. 3. To further improve the on-currents, more fingers may be added.

Figure 7:
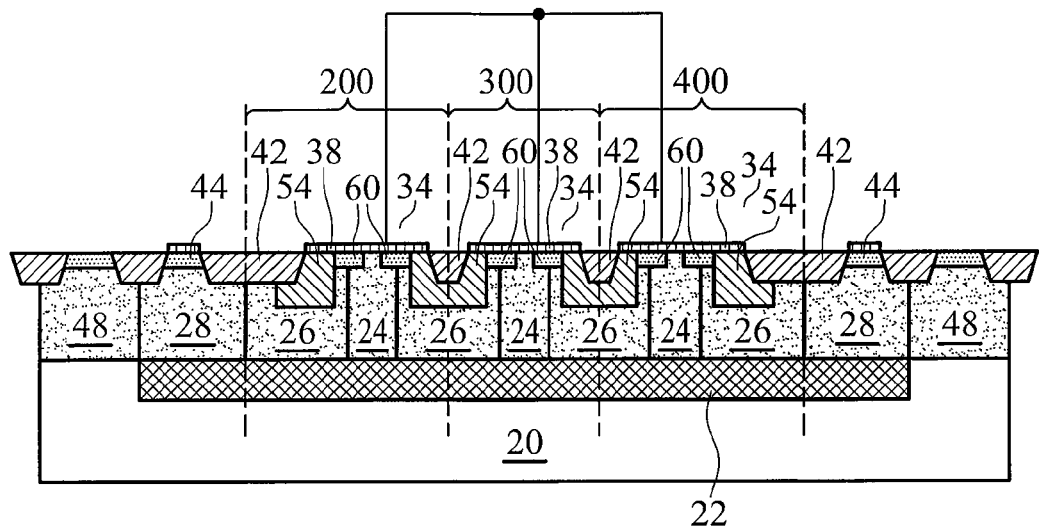
FIG. 7 illustrates an improved Schottky diode having more than one finger, wherein the design of the fingers is modified to improve the on-current per unit area.

Although the Schottky diode shown in FIG. 6 has improved on-currents, the on-current per unit area is not increased over the Schottky diode shown in FIG. 3. It is realized that Schottky diodes occupy significant chip areas, and hence it is desirable to increase the on-currents of Schottky diodes with less increase in the usage of chip areas. An improved Schottky diode embodiment is thus provided, as shown in FIG. 7. The like components may be found in FIG. 7 by identifying like reference numerals in FIG. 3. FIG. 7 illustrates three Schottky diodes 34, with one in each of the regions 200, 300, and 400. In this embodiment, the HVPW region 48 and HVNW region 28 between neighboring Schottky diodes 34 are omitted, while HVPW region 48 and HVNW region 28 are only formed encircling all three diodes (fingers) 34. This embodiment may be viewed as taking the portion in region 600 in FIG. 3 as one finger, and adjoining the fingers side by side. Accordingly, the respective well regions 26, 54, and STI region 42 in neighboring fingers are adjoined edge to edge. If viewed from top, each of the well regions 26, 54, and STI region 42 between neighboring fingers appear to be strips connecting the opposite sides of a greater rectangle. If a higher on-current is required, more fingers may be added using the teaching provided in this paragraph.

Figure 8:
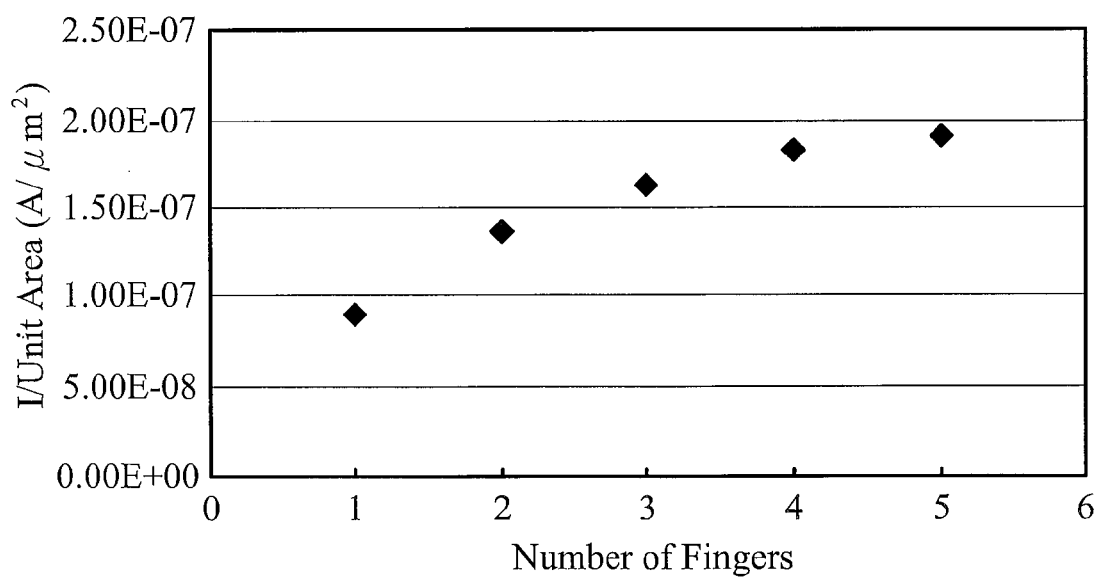
FIG. 8 illustrates an experiment result showing the on-current per unit area of the multi-finger Schottky diode as a function of the number of fingers.

FIG. 8 illustrates an experiment result showing the on-current per unit area of the embodiment shown in FIG. 7 as a function of the number of fingers. It is noted that with the increase in the number of fingers, the on-current per unit area increases. However, further experiments indicate the on-current per unit area peaks when the finger number is about five or six. When the number of fingers further increases, the on-current per unit area reduces. On the other hand, the increase in the finger number does not substantially affect the breakdown voltage of the multi-finger Schottky diodes.

Advantageously, by using the embodiments of the present invention, not only are the leakage currents reduced and on-currents per unit area increased, the on-currents are also improved. Experiments have revealed that the on-currents of the embodiments of the present invention are about one order or even greater than conventional Schottky diodes having similar structures as shown in FIGS. 3, 6 and 7, except LVPW region 54 and P+ region 60 are not formed.

In the above discussed embodiments, the metal-containing layer 38 is formed on HVNW region 24 encircled by HVPW region 26. One skilled in the art will realize that the teaching of the present invention is readily applicable to alternative Schottky diode embodiments having similar structures as shown in FIGS. 3, 6 and 7, with the conductivity types of regions 24, 26, 28, 44, 48, 50, 54, 60, and the like, inverted.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
    a semiconductor substrate;
    a first well region of a first conductivity type over the semiconductor substrate;
    a second well region of a second conductivity type opposite the first conductivity type encircling the first well region;
    a metal-containing layer over and adjoining the first well region and extending over at least an inner portion of the second well region, wherein the metal-containing layer and the first well region form a Schottky barrier;
    an isolation region encircling the metal-containing layer;
    a third well region of the second conductivity type encircling at least a central portion of the first well region, wherein the third well region does not contact any portion of the first well region, and wherein the third well region comprises a top surface adjoining the metal-containing layer, and a bottom surface higher than bottom surfaces of the first and the second well regions;
    a fourth well region having substantially a same impurity concentration and substantially a same depth as the third well region;
    a first core MOS device with portions in the fourth well region;
    a fifth well region of the second conductivity type substantially on an inner side of the third well region, wherein the fifth well region forms a ring encircling a central portion of the first well region; and
    a second core MOS device of an opposite conductivity type than the first core MOS device, wherein the second core MOS device comprises a source/drain region, and wherein the fifth well region has substantially a same impurity concentration and substantially a same depth as the source/drain region.

2. The integrated circuit structure of claim 1 further comprising:
    a sixth well region of the first conductivity type encircling the second well region;
    a buried doped layer of the first conductivity type underlying and contacting the first, the second, and the sixth well regions; and
    a pickup region of the first conductivity type at a surface of the sixth well region.

3. The integrated circuit structure of claim 1, wherein the third well region extends from underlying the isolation region to underlying the metal-containing layer.

4. The integrated circuit structure of claim 1, wherein the third well region has a higher impurity concentration than the second well region.

5. The integrated circuit structure of claim 1, wherein outer edges of the third well region are under, and spaced apart from respective edges of the metal-containing layer.

6. An integrated circuit structure comprising:
    a semiconductor substrate;
    a first high-voltage n-type well (HVNW) region over the semiconductor substrate;
    a first high-voltage p-type well (HVPW) region encircling and adjoining the first HVNW region;
    a metal-containing layer over and adjoining the first HVNW region and the first HVPW region, wherein the metal-containing layer and the first HVNW region form a Schottky barrier;
    an isolation region encircling and adjoining the metal-containing layer;
    a low-voltage p-type well (LVPW) region encircling, and spaced apart from, the first HVNW region, wherein the LVPW region extends from underlying the isolation region to underlying the metal-containing layer;
    a heavily doped p-type (P+) region underlying the metal-containing layer and encircling at least a central portion of the first HVNW region;
    a second HVNW region encircling and adjoining the first HVPW region;
    an n-type buried layer (NBL) over the semiconductor substrate, wherein the NBL is underlying and adjoining the first and the second HVNW regions and the first HVPW region; and
    an n-type heavily doped pickup region at a surface of the second HVNW region.

7. The integrated circuit structure of claim 6 further comprising a second HVPW region encircling the second HVNW region, wherein at least a portion of the second HVPW region is free from the NBL underlying the portion.

8. The integrated circuit structure of claim 6, wherein outer edges of the P+ region are spaced apart from respective edges of the metal-containing layer.

9. The integrated circuit structure of claim 6, wherein the P+ region vertically overlaps outer portions of the first HVNW region.

10. The integrated circuit structure of claim 6, wherein inner edges of the P+ region are substantially vertically aligned to respective edges of the first HVNW region.

11. The integrated circuit structure of claim 6 further comprising:
    a core NMOS device formed in a p-well region, wherein the p-well region has substantially a same impurity concentration and substantially a same depth as the LVPW region; and
    a core PMOS device comprising a source/drain region, wherein the source/drain region has substantially a same impurity concentration and substantially a same depth as the P+ region.

12. An integrated circuit structure comprising:
    a semiconductor substrate of p-type;
    a first Schottky diode finger comprising:
        a first high-voltage n-type well (HVNW) region over the semiconductor substrate;
        a first high-voltage p-type well (HVPW) region encircling and adjoining the first HVNW region;
        a first metal-containing layer over and adjoining the first HVNW region and the first HVPW region, wherein the first metal-containing layer and the first HVNW region form a first Schottky barrier;
        a first isolation region encircling and adjoining the first metal-containing layer;

a first low-voltage p-type well (LVPW) region encircling the first HVNW region; and a first heavily doped p-type (P+) region encircling at least a central portion of the first HVNW region; and a second Schottky diode finger comprising:

a second HVNW region over the semiconductor substrate;

a second HVPW region encircling and adjoining the second HVNW region, wherein the first and the second HVPW regions adjoin each other by one edge to form a continuous region;

a second metal-containing layer over and adjoining the second HVNW region and the second HVPW region, wherein the second metal-containing layer and the second HVNW region form a second Schottky barrier, and wherein the first and the second metal-containing layers are physically disconnected, and electrically connected;

a second isolation region encircling and adjoining the second metal-containing layer, wherein the first and the second isolation regions adjoin each other by one edge to form a continuous region;

a second LVPW region encircling the second HVNW region, wherein the first and the second LVPW regions adjoin each other by one edge to form a continuous region; and a second P+ region encircling at least a central portion of the second HVNW region;

a third HVNW region encircling the first and the second HVNW regions and the first and the second HVPW regions;

an n-type buried layer (NBL) over the semiconductor substrate, wherein the NBL is underlying and adjoining the first and the second HVNW regions, and the first and the second HVPW regions; and a third HVPW region encircling the first and the second HVNW regions, the first and the second HVPW regions, and the first and the second LVPW regions, wherein the third HVPW is electrically connected to the semiconductor substrate.

13. The integrated circuit structure of claim 12, wherein the continuous region comprising the first and the second LVPW regions extends from underlying the first metal-containing layer to underlying the second metal-containing layer, and wherein the first and the second LVPW regions are spaced apart from the first and the second HVNW regions.

14. The integrated circuit structure of claim 12 comprising between 5 and 6 Schottky fingers connected in parallel.

15. The integrated circuit structure of claim 12, wherein the first and the second LVPW regions have a higher impurity concentration, and a smaller depth, than the first and the second HVPW regions, and wherein the first and the second P+ regions have a higher impurity concentration, and a smaller depth, than the first and the second LVPW regions.

* * * * *